US008378361B2

(12) United States Patent
Takeuchi et al.

(10) Patent No.: US 8,378,361 B2
(45) Date of Patent: Feb. 19, 2013

(54) LIGHT-EMITTER, AND LIGHT EMITTING DEVICE INCLUDING A METAL-OXIDE CHARGE INJECTION LAYER

(75) Inventors: Takayuki Takeuchi, Osaka (JP); Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 13/088,654

(22) Filed: Apr. 18, 2011

(65) Prior Publication Data

US 2011/0193107 A1  Aug. 11, 2011

Related U.S. Application Data

(63) Continuation of application No. PCT/JP2010/000785, filed on Feb. 9, 2010.

(30) Foreign Application Priority Data

Aug. 31, 2009 (JP) ................................. 2009-199300

(51) Int. Cl.
H01L 29/16 (2006.01)

(52) U.S. Cl. ............ 257/82; 257/88; 257/214; 257/215; 257/E27.158

(58) Field of Classification Search .................... 257/82, 257/88, 214, 215, E27.083, E27.158
See application file for complete search history.

(56) References Cited

U.S. PATENT DOCUMENTS

| 5,443,922 A | 8/1995 | Nishizaki et al. |
| 2002/0051894 A1 | 5/2002 | Yoshikawa |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2006/0204788 A1 | 9/2006 | Yoshikawa |
| 2006/0232200 A1 | 10/2006 | Ookawa et al. |
| 2006/0284166 A1 | 12/2006 | Chua et al. |
| 2007/0172978 A1 | 7/2007 | Chua et al. |
| 2007/0241665 A1 | 10/2007 | Sakanoue et al. |
| 2008/0007162 A1 | 1/2008 | Ookawa et al. |
| 2009/0160325 A1 | 6/2009 | Yatsunami et al. |

FOREIGN PATENT DOCUMENTS

| CN | 1612657 | 5/2005 |
| JP | 5-163488 | 6/1993 |
| JP | 2002-075661 | 3/2002 |
| JP | 2005-012173 | 1/2005 |
| JP | 2005-197189 | 7/2005 |
| JP | 2005-203339 | 7/2005 |
| JP | 2005-208339 | 8/2005 |
| JP | 2005-268099 | 9/2005 |

(Continued)

OTHER PUBLICATIONS

U.S. Appl. No. 13/091,652 to Hideaki Matsushima, filed Apr. 21, 2011.

U.S. Appl. No. 13/082,674 to Hideaki Matsushima, filed Apr. 8, 2011.

(Continued)

Primary Examiner — Thanh V Pham
(74) Attorney, Agent, or Firm — Greenblum & Bernstein, P.L.C.

(57) ABSTRACT

A light-emitter includes a first electrode and a layered body over the first electrode. The layered body includes a charge injection layer and a light-emitting layer. A bank defines a position of the light-emitting layer of the layered body, and a second electrode is over the layered body. The charge injection layer is formed by oxidation of an upper portion of a metal. The first electrode includes a metal layer that is a lower portion of the metal. An inner portion of the charge injection layer is depressed to define a recess. A portion of the bank is on an outer portion of the charge injection layer.

13 Claims, 16 Drawing Sheets

| | FOREIGN PATENT DOCUMENTS | |
|---|---|---|
| JP | 2006-286664 | 10/2006 |
| JP | 2006-294261 | 10/2006 |
| JP | 2007-527542 | 9/2007 |
| JP | 2007-288071 | 11/2007 |
| JP | 2009-004347 | 1/2009 |
| WO | 2004/100282 | 11/2004 |

OTHER PUBLICATIONS

U.S. Appl. No. 13/091,667 to Hideaki Matsushima, filed Apr. 21, 2011.
International Search Report in PCT/JP2010/000785, mailing date of Mar. 23, 2010.
China Office Action in Chinese Patent Application No. 201080001855.6, dated Jul. 17, 2012.

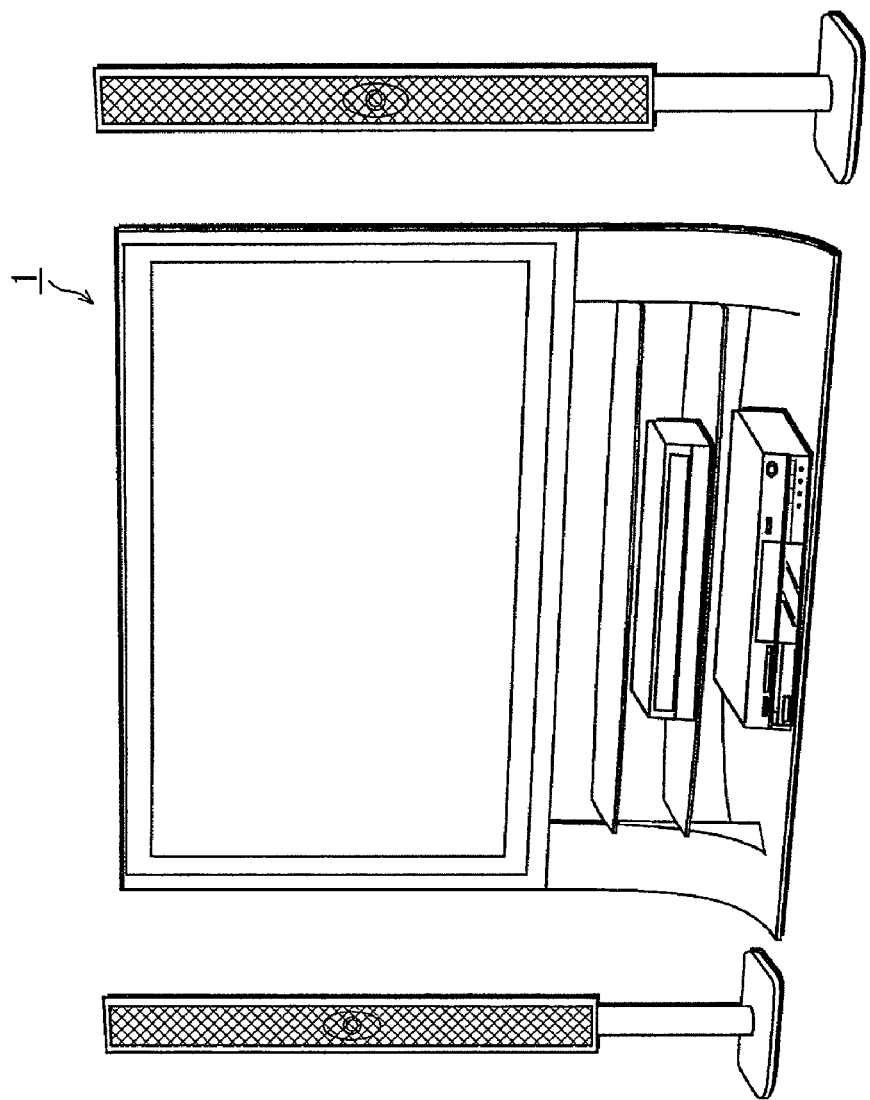

LIGHT-EMITTER, AND LIGHT EMITTING DEVICE INCLUDING A METAL-OXIDE CHARGE INJECTION LAYER

CROSS REFERENCE TO RELATED APPLICATION

This is a continuation application of PCT Application No. PCT/JP2010/000785 filed Feb. 9, 2010, designating the United States of America, the disclosure of which, including the specification, drawings and claims, is incorporated herein by reference in its entirety.

The disclosure of Japanese Patent Application No. 2009-199300, filed on Aug. 31, 2009, including the specification, drawings, and claims is incorporated herein by reference in its entirety.

BACKGROUND OF THE INVENTION

1. Field of the Invention

The present invention relates to a light-emitter that takes advantage of an electroluminescence phenomenon of an organic material, a method of manufacturing the same and a light-emitting device.

2. Description of the Related Art

In recent years, an organic electroluminescence element (hereinafter referred to as "organic EL element") has been studied and developed. The organic EL element is a light-emitter that takes advantage of an electroluminescence phenomenon of an organic material. The organic EL element has a structure in which an organic light-emitting layer is positioned between an anode and a cathode. A hole is injected from the anode and an electron is injected from the cathode. In this way, the hole and the electron are recombined in the organic light-emitting layer. This is how the organic EL element emits light. Note that a form of the light-emitting layer is defined by a bank that is formed with use of an insulating material.

Between the anode and the organic light-emitting layer is provided any of layers such as a hole-injection layer, a hole-transport layer and a hole-injection/transport layer, as needed. Between the cathode and the organic light-emitting layer is provided any of layers such as an electron-injection layer, an electron-transport layer and an electron-injection/transport layer, as needed. Hereinafter, the hole-injection layer, the hole transport layer, the hole-injection/transport layer, the electron-injection layer, the electron-transport layer and the electron-injection/transport layer are collectively referred to as a "charge-injection/transport layer".

A charge-injection/transport layer of a conventional organic EL element is formed with use of a conductive polymer material such as PEDOT (a mixture of polythiophene and polystyrene sulfonate) as shown in the following chemical formula 1 (see Patent Literature 1, for example).

[Chemical formula 1]

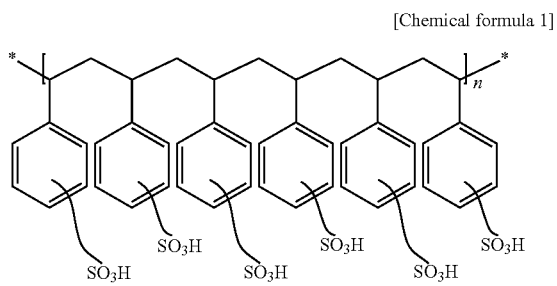

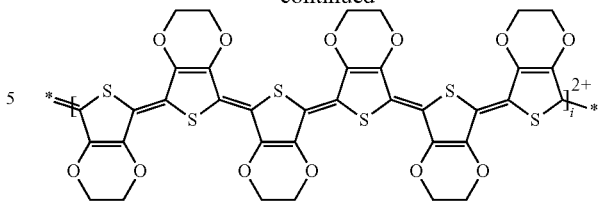

In recent years, technology has been developed in which the charge-injection/transport layer is formed with use of metal oxide such as transition metal oxide in place of the PEDOT (see Patent Literatures 2 and 3, for example). An organic EL element having the charge-injection/transport layer formed with use of the metal oxide generally has the following advantages compared to the organic EL element having the charge-injection/transport layer formed with use of the PEDOT. One of the advantages is that the organic EL element has an excellent voltage-current density property. The other advantage is that the organic EL element is less likely to deteriorate even if a large current is applied to increase light-emitting intensity.

3. Patent Literatures

[Patent Literature 1] Japanese Patent Application Publication No. 2007-527542.

[Patent Literature 2] Japanese Patent Application Publication No. 2007-288071.

[Patent Literature 3] Japanese Patent Application Publication No. 2005-203339.

SUMMARY OF INVENTION

However, even if the metal oxide is used for forming the charge-injection/transport layer as described above, it is still necessary to further improve the light-emitting property. Also, it is necessary to further lengthen an operating life of the element.

The present invention has been achieved in view of the above problems, and an aim thereof is to provide a light-emitter, a method of manufacturing the same and a light-emitting device. Here, the light-emitter has a high light-emitting property and a long operating life even if the metal oxide is used for forming the charge-injection/transport layer.

One aspect of the present invention is a light-emitter comprising: a first electrode; a layered body that is composed of at least a charge injection transport layer and a light-emitting layer, and is disposed on the first electrode; a second electrode disposed on the layered body; and a bank that defines a formation area of the light-emitting layer, wherein the charge injection transport layer is formed by oxidizing an upper surface portion of a metal, the first electrode includes a metal layer that is a lower portion of the metal than the oxidized upper surface portion, an upper surface portion of the charge injection transport layer is partially depressed to form a recess, and an upper peripheral edge of the recess is covered with a portion of the bank.

According to the light-emitter pertaining to one aspect of the present invention, an upper peripheral edge of the recess included in the charge-injection/transport layer is covered with a portion of a bank that is formed with use of an insulating material. Therefore, it is possible to suppress the electrical field from being concentrated in the upper peripheral edge of the recess when light is emitted. Therefore, the light-emitter pertaining to one aspect of the present invention has a light-emitting property and an operating life that have been further improved.

BRIEF DESCRIPTION OF THE DRAWINGS

FIG. 16 is a perspective view showing an aspect of the display device 1.

DESCRIPTION OF THE PREFERRED EMBODIMENT(S)

Inventors have found, after an earnest research, that the following problems arise when a charge-injection/transport layer is formed with use of metal oxide as described in the above Background Art. After the formation of the charge-injection/transport layer, a surface portion of the charge-injection/transport layer is partially depressed after being eroded by solution used for a wet process for forming a bank. This forms a recess and causes an electrical field to be concentrated in an upper peripheral edge of the recess when light is emitted. The inventors had studied these problems much and have found the following facts.

Figure 1A:
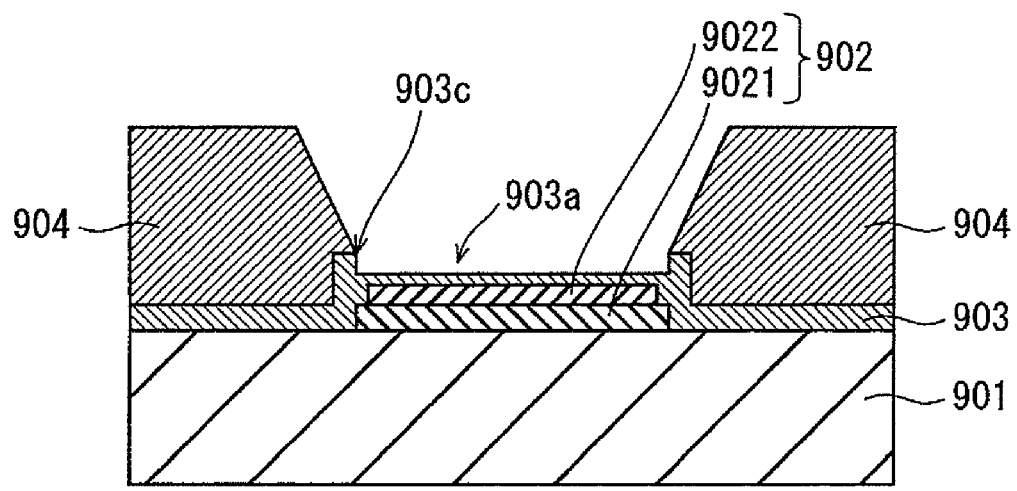
FIG. 1A and FIG. 1B each show an end elevation used for explaining how one aspect has been reached.
Figure 1B:
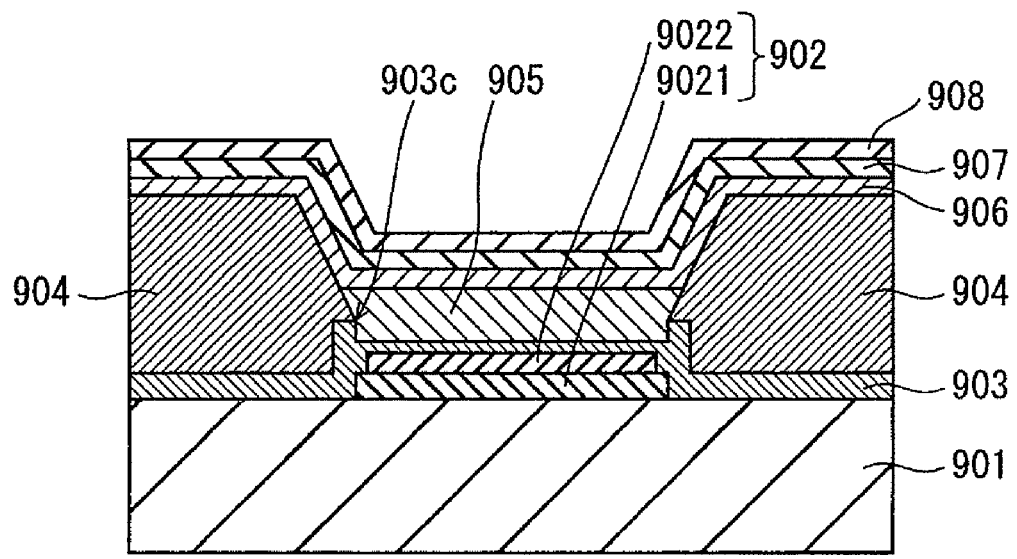

FIG. 1A and FIG. 1B show end elevations each showing part of a process of manufacturing an organic EL display.

As shown in FIG. 1A, an anode 902, a hole-injection/transport layer 903 and a bank 904 are formed on a TFT substrate 901. Note that the anode 902 has a layer structure in which an anode base layer 9021 and an ITO (Indium Tin Oxide) layer 9022 are layered on a surface of the TFT substrate 901 in the stated order.

As shown in FIG. 1B, an organic light-emitting layer 905, an electron-injection layer 906, a cathode 907 and a passivation layer 908 are layered on the hole-injection/transport layer 903 in the stated order.

When the hole-injection/transport layer 903 is formed with use of the metal oxide, a recess 903a is formed on an upper surface of the hole-injection/transport layer 903 (see FIG. 1A) in a process of forming the bank 904. When the organic light-emitting layer 905 is formed with the recess 903a formed on the upper surface of the hole-injection/transport layer 903 (see FIG. 1B), the following phenomenon occurs. That is, an electrical field is concentrated in a vicinity of an edge 903c of the recess 903a (see FIG. 1A) when light is emitted in an organic El display. As a result, current locally flows to the organic light-emitting layer 905 in some cases, which results in uneven brightness on a light-emitting surface and a short operating life due to a local deterioration.

The above-described problems and findings are unique to an organic EL display panel whose hole-injection/transport layer 903 is formed with use of the metal oxide. Also, the above-described problems and findings had not been ascertained. Therefore, these problems and findings have technical significance.

As described in the above, the inventors have reached the following technical features after a series of research and studies. That is, when the hole-injection/transport layer is formed with use of the metal oxide, the upper peripheral edge of the recess is covered with a portion of a bank. This suppresses the electrical field from being concentrated in a vicinity of the upper peripheral edge of the recess when light is emitted. As a result, the current is suppressed from locally flowing to the organic light-emitting layer.

One aspect of the light-emitter pertaining to the present invention is a light-emitter comprising: a first electrode; a layered body that is composed of at least a charge injection transport layer and a light-emitting layer, and is disposed on the first electrode; a second electrode disposed on the layered body; and a bank that defines a formation area of the light-emitting layer, wherein the charge injection transport layer is formed by oxidizing an upper surface portion of a metal, the first electrode includes a metal layer that is a lower portion of the metal than the oxidized upper surface portion, an upper surface portion of the charge injection transport layer is partially depressed to form a recess, and an upper peripheral edge of the recess is covered with a portion of the bank.

According to one aspect of the light-emitter pertaining to the present invention, a bottom surface of the recess is in contact with a bottom surface of the light-emitting layer According to one aspect of the light-emitter pertaining to the present invention, the upper peripheral edge of the recess included in the charge-injection/transport layer is covered with the portion of the bank that is formed with use of the insulating material. Therefore, it is possible to suppress the electrical field from being concentrated in the upper peripheral edge of the recess when light is emitted. Therefore, the light-emitter pertaining to one aspect of the present invention can suppress current from locally flowing to the light-emitting layer.

According to one aspect of the light-emitter pertaining to the present invention, the oxidized upper surface portion is erosive by solution used for forming the bank. When the oxidized upper surface portion is erosive by solution used in forming the bank in the above-stated way, the charge-injection/transport layer having the recess is formed as described above. However, it is possible to suppress current from locally flowing to the light-emitting layer by adopting the structure in which the upper peripheral edge of the recess is covered with the portion of the bank as described above.

According to one aspect of the light-emitter pertaining to the present invention, a bottom surface of the portion of the bank reaches the bottom surface of the recess, and each inner side wall of the bank slopes upwardly with respect to the bottom surface of the recess. With such a structure, it is easy to allow ink to be absorbed in every corner of the area defined by the bank when the light-emitting layer is formed in a printing technology such as an inkjet method. Thus it is possible to suppress formation of a void, for example.

According to one aspect of the light-emitter pertaining to the present invention, the portion of the bank is spaced away from the bottom surface of the recess. When such a structure is adopted, it is not necessary to allow the bank material to reach a bottom surface of the recess. Therefore, a temperature for the heat treatment can be low or time necessary for the heat treatment can be shortened.

According to one aspect of the light-emitter pertaining to the present invention, the first electrode has one of a monolayer structure and a layer structure. Thus, the above-described structure can be adopted for various types of elements.

According to one aspect of the light-emitter pertaining to the present invention, the first electrode has the layer structure composed of an upper layer that is the metal layer and a lower layer having a visible light reflectance of 60% or greater. With such a structure, the lower layer can be formed independently from the oxidized upper surface portion. Also, the lower layer can be formed with use of metal having high reflectance. Therefore, a wide range of material selection is available for each layer. Thus, it is possible to facilitate the optimization of the performance of the top-emission type organic EL element, in particular.

According to one aspect of the light-emitter pertaining to the present invention, the first electrode has the layer structure composed of an upper layer that is the metal layer including at least one of molybdenum, chrome, vanadium, tungsten, nickel and iridium and a lower layer that is alloy including at least one of aluminum and silver.

According to one aspect of the light-emitter pertaining to the present invention, the metal layer has a film thickness of 20 nm or less. With such a structure, it is possible to effectively suppress a decrease in reflectance of the upper layer (i.e. deterioration in a light-emitting property of the top-emission type organic EL element). Thus, it is possible to make the best of the high reflectance of the lower layer.

According to one aspect of the light-emitter pertaining to the present invention, the light-emitting layer is an organic EL layer.

According to one aspect of the light-emitter pertaining to the present invention, each end portion of the charge injection transport layer may protrude into the bank along a base of the bank.

According to one aspect of the light-emitter pertaining to the present invention, the upper peripheral edge of the recess may be defined by an angle formed between two surfaces, one of the surfaces being a surface of an edge potion of the upper surface portion and the other surface being one of side walls of the recess, the edge portion being a portion on which the recess is not formed.

According to one aspect of a light-emitting device pertaining to the present invention, a light-emitting device including the plurality of light-emitters described in the above.

According to one aspect of a method of manufacturing a light-emitter that pertains to the present invention, A method of manufacturing a light-emitter comprising a first electrode; a layered body that is composed of at least a charge injection transport layer and a light-emitting layer, and is disposed on the first electrode; a second electrode disposed on the layered body; and a bank that defines a formation area of the light-emitting layer, the method comprising: a first process of forming a metal layer; a second process of forming a metal oxide layer by oxidizing an upper surface portion of the metal layer; a third process of forming a bank material layer on the metal oxide layer with use of a material used for forming the bank; a fourth process of removing a portion of the bank material layer and a portion of the metal oxide layer, a surface of which is exposed to an area from which the portion of the bank material layer has been removed, so as to expose, to the area, a surface of a portion of an unoxidized portion of the metal layer; a fifth process of oxidizing a portion of the metal layer around the exposed surface so that a combination of the oxidized portion and an unremoved portion of the metal oxide layer is the charge injection transport layer while a portion of the metal layer that has not yet been oxidized is included in the first electrode; a sixth process of thermally treating a portion of an unremoved portion of the bank material layer, the portion of the unremoved portion of the bank material layer being positioned on the unremoved portion of the metal oxide layer; and a seventh process of forming a light-emitting layer in the area after the sixth process, the light-emitting layer being positioned on the charge injection transport layer.

Also, according to one aspect of the method pertaining to the present invention, the charge injection transport layer is formed with use of a material that is erosive by solution used for removing the portion of the bank material layer in the fourth process, a portion of the charge injection transport layer is depressed by the erosion of the solution to form a recess whose bottom surface is the exposed surface so that the exposed surface is lower than a bottom surface of the portion of the unremoved portion of the bank material layer, and in the sixth process, fluidity is given to the unremoved portion of the bank material layer so that the material used for forming the bank extends to an upper peripheral edge of the recess According to one aspect of the method pertaining to the present invention, the oxidization in each of the second and fifth processes is one of natural oxidization by air exposure and oxidization in an oxidizing process.

According to one aspect of the method pertaining to the present invention, the oxidization in each of the second and fifth processes is natural oxidization by air exposure. With such a structure, a process exclusively for the oxidization is not necessary, which is efficient in terms of productivity.

According to one aspect of the method pertaining to the present invention, the first electrode has one of a monolayer structure and a layer structure.

According to one aspect of the method pertaining to the present invention, in the first process, the metal layer is formed on a lower layer having a visible reflectance of 60% or greater. As a result of execution of the fifth process, the first electrode has a layer structure composed of the lower layer and an upper layer that is the metal layer. When such a structure is adopted, the lower layer can be formed independently from the upper layer that is the metal oxide layer. Also, the lower layer can be formed with use of metal having high reflectance. Therefore, a wide range of material selection is available for each layer. Therefore, it is possible to facilitate optimization of the performance of the top-emission type organic EL element in manufacturing the top-emission type organic EL element.

According to one aspect of the method pertaining to the present invention, in the first process, the metal layer is formed on a lower layer that is alloy including at least one of aluminum and silver, the metal layer including at least one of molybdenum, chrome, vanadium, tungsten, nickel and iridium. As a result of execution of the fifth process, the first electrode has a layer structure composed of the lower layer and an upper layer that is the metal layer.

According to one aspect of the method pertaining to the present invention, the portion of the metal layer included in the first electrode has a film thickness of 20 nm or less. With such a structure, it is possible to effectively suppress a decrease in reflectance of the upper layer (i.e. deterioration in a light-emitting property of the top-emission type organic EL layer). Thus, it is possible to make the best of high reflectance of the lower layer.

The following describes embodiments with use of a few examples.

It should be appreciated, however, that the specific embodiments and modifications described below are given for the purpose of illustrating the structures of the present invention and effects achieved by the structures. The present invention is not so limited and various other changes and modifications may be made without departing from the spirit and scope of the claimed invention.

[First Embodiment]

1. Overall Structure of Display Device 1

Figure 2:
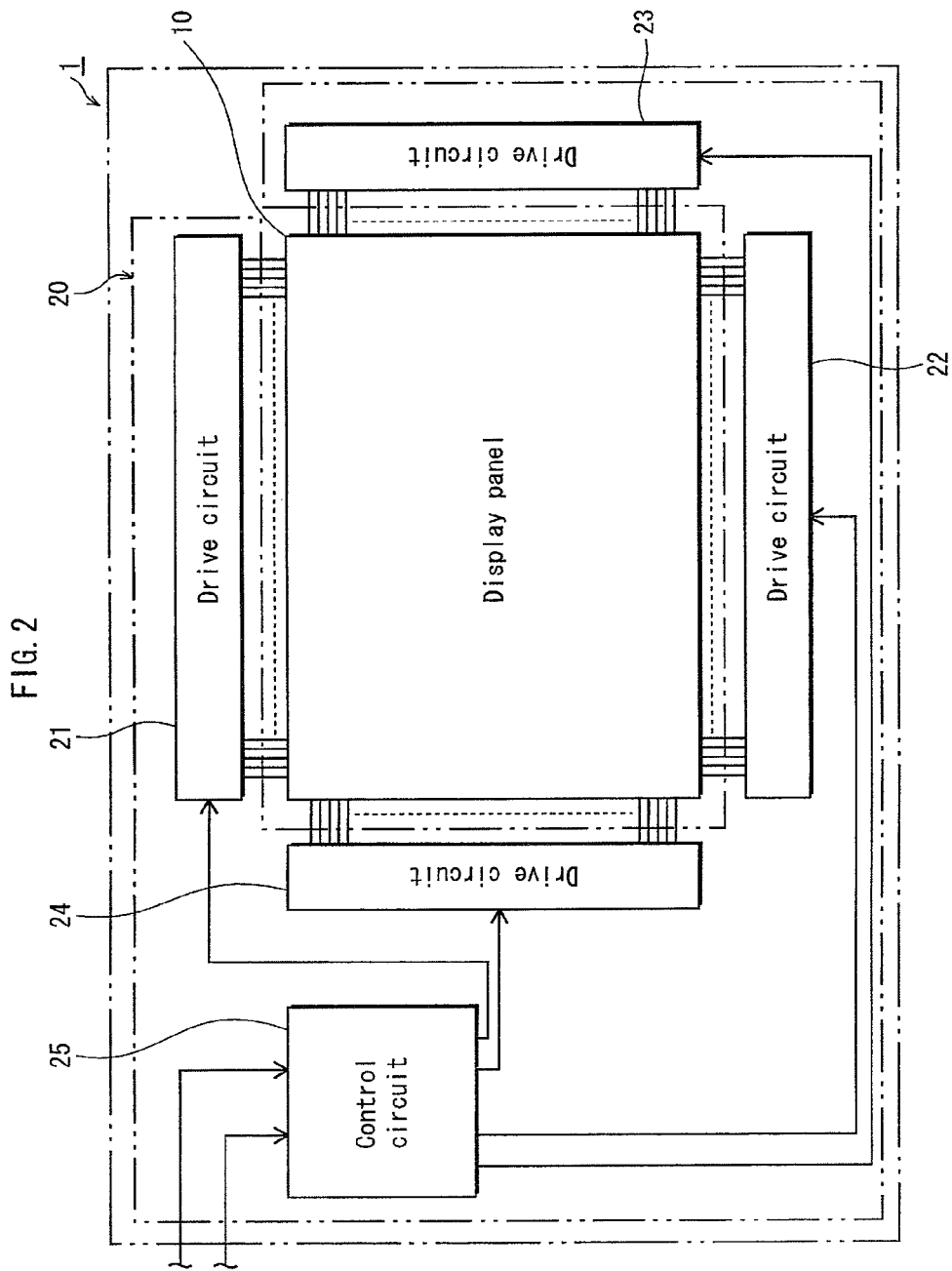
FIG. 2 is a block diagram that schematically shows an overall structure of a display device 1 pertaining to a first embodiment.

The overall structure of the display device 1 pertaining to a first embodiment is described with use of FIG. 2.

As shown in FIG. 2, the display device 1 includes a display panel 10 and a drive control unit 20 that is connected to the display panel 10. The display panel 10 is an organic EL panel that takes advantage of an electroluminescence phenomenon of an organic material, and is composed of a plurality of organic EL elements that are arranged.

Also, the drive control unit 20 includes four drive circuits 21 to 24 and a control circuit 25.

Note that the arrangement relation of the drive control unit 20 with the display panel 10 is not actually limited to the arrangement as shown in FIG. 2.

2. Structure of Display Panel 10

Figure 3:
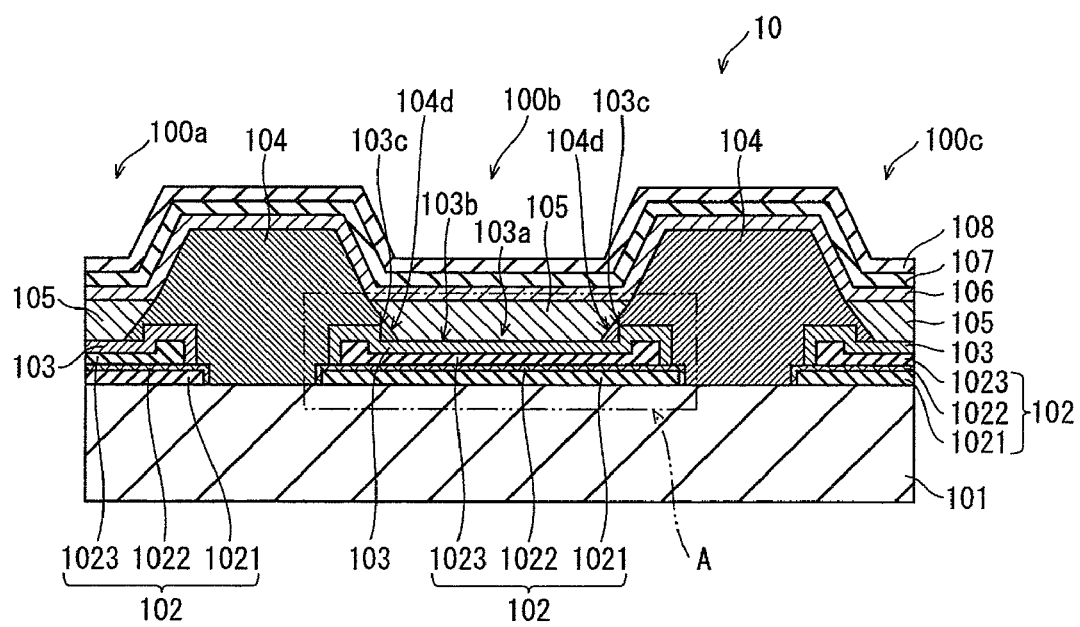
FIG. 3 is an end elevation that schematically shows a main part of a display panel 10 included in the display device 1.
Figure 4:
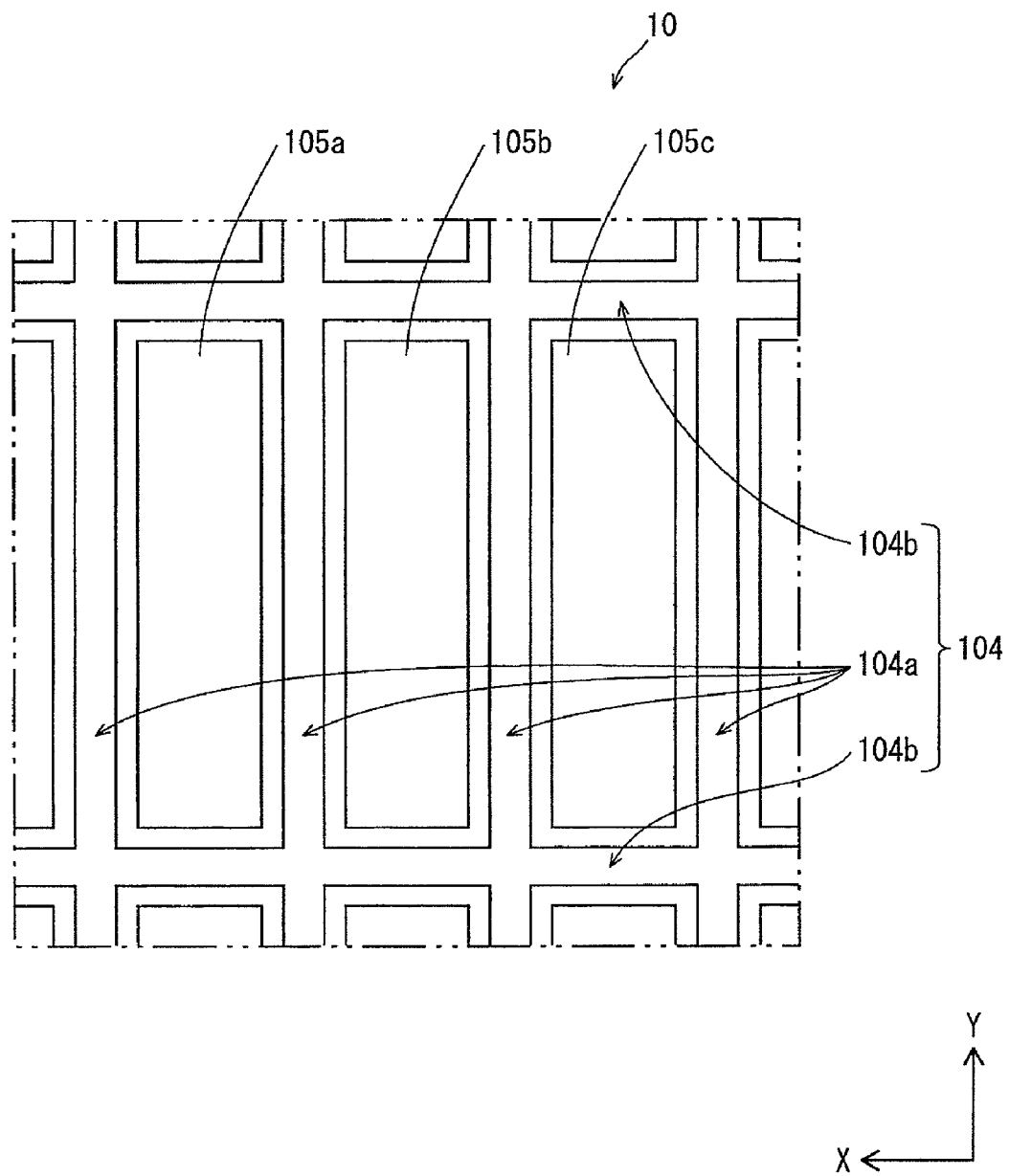
FIG. 4 is a schematic plane view that shows a form of a bank 104 included in the display device 1.

The following describes the structure of the display panel 10 with use of FIG. 3 and FIG. 4.

As shown in FIG. 3, the display panel 10 has a structure in which organic EL elements 100a, 100b and 100c are arranged in a matrix. Here, each of the organic EL elements 100a, 100b and 100c has an organic light-emitting layer that emits one of emission colors of red (R), green (G) and blue (B). The display panel 10 is a top-emission type organic EL display.

An anode 102 is formed on a TFT substrate (hereinafter, simply referred to as "substrate") 101. A hole-injection/transport layer 103 is layered on the anode 102. Note that the anode 102 has a layer structure in which an anode base layer 1021, an ITO (Indium Tin Oxide) layer 1022 and an anode metal layer 1023 are layered on a surface of the substrate 101 in the stated order. Note that the anode 102 is separately formed for each of the organic light-emitting elements 100a, 100b and 100c.

As shown in FIG. 3, the hole-injection/transport layer 103 is provided peripherally above the anode 102. Above the hole-injection/transport layer 103, an organic light-emitting layer 105 is formed. Here, the organic light-emitting layer 105 is formed in an area defined by a bank 104 that is formed with use of an insulating material. Furthermore, an electron-injection layer 106, a cathode 107 and a passivation layer 108 are formed on the organic light-emitting layer 105. Here, the electron-injection layer 106, the cathode 107 and the passivation layer 108 are formed integrally over areas defined by the bank 104 through the organic El elements 100a, 100b and 100c.

Note that a so-called pixel bank is adopted as the bank 104 in the display panel 10 as shown in FIG. 4. Here, the pixel bank (bank 104) is formed such that bank elements 104a that extend in a Y direction and bank elements 104b that extend in an X direction are integrated. Also, organic light-emitting layers 105a, 105b and 105c (sub pixels) that are consecutive in the X direction are delimited from one another by the bank elements 104a. Similarly, the organic light-emitting layers 105a, 105b and 105c (sub pixels) that are consecutive in the Y direction are delimited from one another by the bank elements 104b.

As shown in FIG. 4, each of the three sub pixels that are consecutive in the X direction correspond to one of red (R), green (G) and blue (B). A set of the three consecutive sub pixels composes one pixel.

a) Substrate 101

The substrate 101 is based on an insulating material such as alkali-free glass, soda glass, nonluminescent glass, phosphate glass, boric-acid glass, quartz, acrylic resin, styrene resin, polycarbonate resin, epoxy resin, polyethylene, polyester, silicon resin or alumina.

b) Anode 102

The anode base layer 1021 of the anode 102 is formed with use of Ag (silver), APC (alloy of silver, palladium and copper), ARA (alloy of silver, rubidium and gold), MoCr (alloy of molybdenum and chrome) and NiCr (alloy of nickel and chrome), for example. Note that in a case where the organic EL element is a top-emission type EL element as shown in the above, it is preferable that the anode base layer 1021 is formed with use of a material having high reflectivity.

The ITO layer 1022 is formed so as to cover the surface of the anode base layer 1021.

The anode metal layer 1023 is formed with use of a metal material such as silver (Ag), molybdenum (Mo), chrome (Cr), vanadium (V), tungsten (W), nickel (Ni) or iridium (Ir), or an alloy of these metal materials, for example.

Note that the following section "Method of Manufacturing Organic EL element" in the present embodiment describes the following. That is, a surface portion of a metal layer is oxidized, and a remaining portion of the metal layer that has not been oxidized (lower metal layer) is the anode metal layer 1023 of the anode 102.

Figure 5:
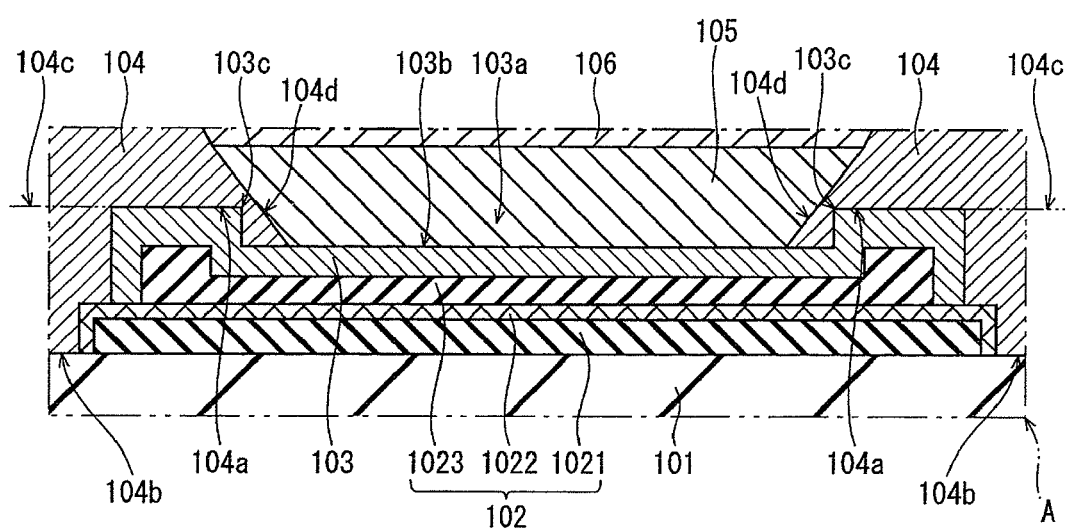
FIG. 5 shows, as a portion A, an end elevation which is a portion of FIG. 1 that has been enlarged.

Note that a portion of the anode metal layer 1023 under an opening formed in the bank 104 is smaller in film thickness than the other portion of the anode metal layer 1023 as shown in FIG. 5. It is preferable that the portion of the anode metal layer 1023 is 20 [nm] or less in film thickness. This is because when the portion is more than 20 [nm] in film thickness, a reflectance of each of the organic EL elements 100a, 100b and 100c reflects a reflectance of the anode metal layer 1023, and thus is unlikely to reflect the reflectance of the anode base layer 1021.

c) Hole-Injection/Transport Layer 103

The hole-injection/transport layer 103 is an upper metal oxide layer that is formed by oxidizing a surface portion of a metal layer as described in the above. Therefore, the hole-injection/transport layer 103 is composed of oxides such as silver (Ag), molybdenum (Mo), chrome (Cr), vanadium (V), tungsten (W), nickel (Ni) and iridium (Ir). The hole-injection/transport layer 103 formed with use of such metal oxides has functions of supporting stable generation of the hole and injecting and transporting the hole in and to the organic light-emitting layer 105. Also, the hole-injection/transport layer 103 having such functions has a large work function.

Note that when the hole-injection/transport layer 103 is formed with use of oxides of the transition metal, the oxidization number is plural. Therefore, there can be a plurality of oxidization levels. As a result, the hole can be easily injected, and thus the drive voltage can be reduced.

As shown in FIG. 5, the hole-injection/transport layer 103 laterally extends along the bases 104a and 104b of the bank 104, and the upper surface portion of the hole-injection/transport layer 103 is partially depressed so as to form a recess 103a. A base 103b of the recess 103a included in the hole-injection/transport layer 103 is positioned lower than a level 104c of the base 104a of the bank 104. The recess 103a in the hole-injection/transport layer 103 is approximately 5 [nm] to 30 [nm] in depth.

Also, the hole-injection/transport layer 103 is preferably 0.1 [nm] to 20 [nm] in film thickness, and is more preferably 1 [nm] to 10 [nm] in film thickness, for example. This is because when the film thickness of the hole-injection/transport layer 103 (i.e. thickness of the upper metal oxide layer (oxidized portion of the metal layer)) is smaller than the above-stated preferable value, a hole-injection property in terms of evenness decreases. When the film thickness of the hole-injection/transport layer 103 is larger than the above-stated preferable value, on the other hand, a drive voltage increases.

Also, according to the organic EL elements 100a, 100b and 100c pertaining to the present embodiment, a peripheral edge 103c of the recess 103a included in the hole-injection/transport layer 103 is covered with a covering portion 104d of the bank 104. The peripheral edge 103c included in the hole-injection/transport layer 103 protrudes higher than the base 103b of the recess 103a. If the peripheral edge 103c were not covered with the insulating covering portion 104d, the electrical field would be concentrated in a vicinity of the peripheral edge 103c, and the current would locally flow to the organic light-emitting layer 105. As a result, problems arise that are the uneven brightness in the light-emitting surface and a short operating life due to the local deterioration of the organic light-emitting layer 105.

However, according to the organic EL elements 100a, 100b and 100c pertaining to the present embodiment, since the peripheral edge 103c is covered with the insulating covering portion 104d, the above-stated problems can be suppressed. Note that it is preferable that the thickness of the covering portion 104d of the bank 104 (shortest distance between the peripheral edge 103c and the organic light-emitting layer 105) is 2 [nm] to 5 [nm] in order to effectively suppress the electrical field concentration.

Also, FIG. 3 shows an exemplary case in which a form of the peripheral edge 103c included in the hole-injection/transport layer 103 has an edge contour. However, when the form of the peripheral edge 103c included in the hole-injection/transport layer 103 is polygonal or circular, the electrical filed concentration can be suppressed more compared to the above-stated exemplary case.

Also, according to the organic EL elements 100a, 100b and 100c pertaining to the present embodiment, the covering portion 104d of the bank 104 reaches the base 103b of the recess 103a included in the hole-injection/transport layer 103. Also, each inner side wall of the bank 104 slopes upwardly with respect to the base 103b of the recess 103a included in the hole-injection/transport layer 103. With such a structure, when the organic light-emitting layer 105 is formed with use of ink in printing technology such as an inkjet method, the ink can be easily absorbed in every corner of the area defined by the bank. As a result, formation of a void etc. can be suppressed.

The method of oxidizing the surface portion of the metal layer in order to form the hole-injection/transport layer 103 is not particularly limited. Therefore, examples of the process that can be adopted are natural oxidization, ultraviolet ozone process on a principal surface of the metal layer, a plasma process under an oxidized gas atmosphere and a process with use of solution containing ozone.

d) Bank 104

The bank 104 is formed with use of an organic material such as resin, and has an insulating property. Examples of the organic material used for forming the bank are acrylic resin, polyimide resin and novolac-type phenolic resin. It is preferable that the bank 104 has an organic-solvent resistance. Furthermore, since the bank 104 is subjected to an etching process and a bake process etc. in some cases, it is preferable that the bank 104 is formed with use of a material having so high resistance that the bank 104 is not deformed or altered, for example, when subjected to these processes. Also, the surface of the bank 104 may be fluorine-processed so that the bank 104 has a water-shedding property.

The insulating material used for forming the bank 104 may be one of the above-mentioned materials or material that is especially $10^5$ [Ω·cm] or greater in insulation resistibility and has a water-shedding property. This is because when a material that is smaller than $10^5$ [Ω·cm] in insulating resistibility is used for forming the bank 104, leakage current between the anode 102 and the cathode 107 or leakage current between adjacent elements possibly occurs. This possibly causes kinds of problems such as an increase in power consumption.

Also, when the bank 104 is formed with use of a material that has a hydrophilic property, a difference between the surface of the bank 104 and the surface of the hole-injection/transport layer 103 in hydrophilic/water-shading property becomes small. Thus, it is difficult to selectively allow the opening formed in the bank 104 to contain the ink including an organic material for forming the light-emitting layer 105.

Furthermore, the structure of the bank 104 is not limited to the monolayer structure shown in FIG. 3 and FIG. 5. Therefore, a multilayer structure including two or more layers is possible. In this case, the above-described materials may be combined for each layer, or an inorganic material and an organic material may be used for each layer.

e) Organic Light-emitting Layer 105

The organic light-emitting layer 105 has a function of emitting light. In order for the organic light-emitting layer 105 to emit light, the hole and the electron are injected and recombined so as to cause an excited state. It is necessary that a material used for forming the organic light-emitting layer 105 can be used for forming a film in a wet printing method, and has a light-emitting property.

To give a concrete example, fluorescent materials disclosed in Japanese Patent Application Publication No. H5-163488 that can be used for the organic EL layer are: oxinoid compounds, perylene compounds, coumalin compounds, azacoumalin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes containing 8-hydroxyquinoline derivatives, metal complexes containing 2,2'-bipyridine derivatives, group III metal complexes containing Schiff base, metal complexes containing oxine, rare earth metal complexes, etc.

f) Electron-injection Layer 106

The electron-injection layer 106 has a function of transporting, to the organic light-emitting layer 105, electron injected from the cathode 107. The electron-injection layer 106 is preferably formed with use of valium, phthalocyanine or fluorine lithium and a combination of these, for example.

g) Cathode 107

The cathode 107 is formed with use of ITO and IZO (Indium Zinc Oxide), for example. In the case of the top-emission type organic EL elements 100a, 100b and 100c, the cathode 107 is preferably formed with use of a light-transmitting material. Transmittance of the light-transmitting material is preferably 80% or greater.

Besides the above-stated materials, the cathode 107 may be formed with use of a material having a structure in which a layer containing alkali metal, alkali earth metal or halogen compound of alkali metal and alkali earth metal and a layer containing silver are layered in the stated order. The above-stated layer containing silver may be formed with use of silver alone or silver alloy. Also, a refractive index adjustment layer having high transmittance may be provided on the layer containing silver in order to increase light takeoff efficiency.

h) Passivation Layer 108

The passivation layer 108 has functions of suppressing the organic light-emitting layer 105 etc. from being exposed to moisture and air. The passivation layer 108 is formed with use of a material such as SiN (silicon nitride) or SiON (Silicon oxynitride). In the case of the top-emission type organic EL elements 100a, 100b and 100c, the passivation layer 108 is preferably formed with use of a light-transmitting material.

3. Method of Manufacturing Display Panel 10

The following describes a method of manufacturing the display panel 10, with reference to FIGS. 6A, 6B and 6C, FIGS. 7A, 7B and 7C and FIGS. 8A, 8B and 8C. Note that one of organic EL elements included in the display panel 10 is taken as an example and schematically shown in these drawings.

Figure 6A:
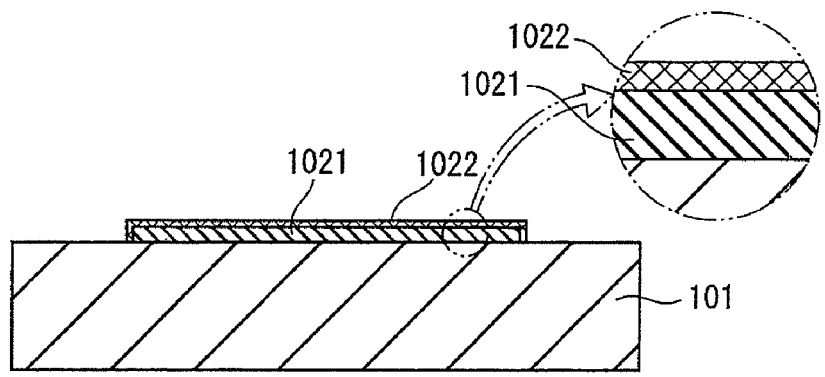
FIGS. 6A, 6B and 6C are end elevations that each schematically show part of a process in manufacturing the display device 1.

Firstly, an Ag thin film is formed on a principal surface of the substrate 101 with use of a spattering method, as shown in FIG. 6A. Then, a patterning is performed on the Ag thin film with use of a photolithography, for example, to form the anode base layers 1021 in a matrix. Note that a vacuum evaporation method may be used instead of the spattering method of forming the Ag thin film.

Next, an ITO thin film is formed on a surface of the anode base layer 1021 with use of the spattering method, for example. Then, the patterning is performed on the ITO thin film with use of the photolithography, for example, to form the ITO layer 1022.

Figure 6B:
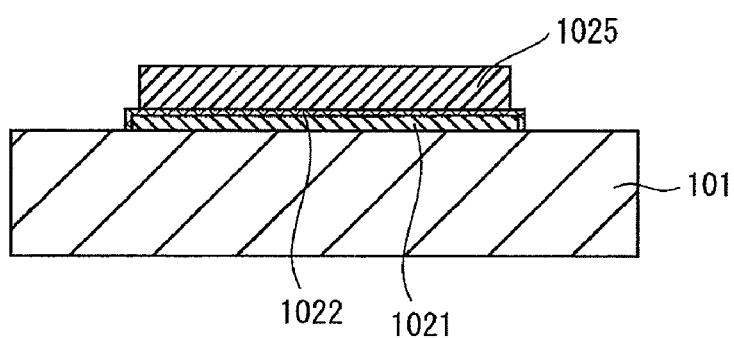

Next, a metal film of Mo—Cr (97:3) is formed on the principal surface of the substrate 101 including the ITO layer 1022 with use of the spattering method as shown in FIG. 6B. Here, the metal film is 100 [nm] in film thickness. Then, the patterning is performed on the metal film of Mo—Cr (97:3) with use of a method using a photosensitive resist (the photolithography method or the etching method). After the patterning, the photosensitive resist is removed. As a result, a metal layer 1025 is formed. When the etching method is adopted for forming the metal layer 1025, mixed solution of phosphoric acid, nitric acid and acetic acid may be used as etching solution.

Figure 6C:
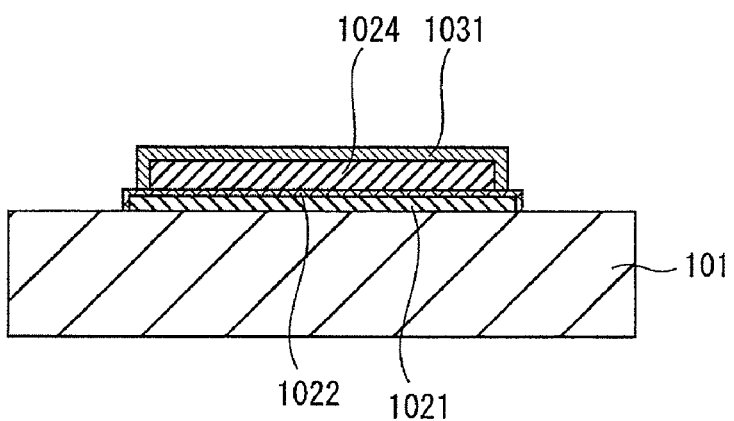

As shown in FIG. 6C, a surface portion of the metal layer 1025 formed on the ITO layer 1022 as shown in the above is naturally oxidized. The oxidized portion becomes a metal oxide layer 1031. The remaining portion of the metal layer 1025 that has not been oxidized becomes a metal layer 1024. At this stage, the oxidized portion (the metal oxide layer 1031) is 1 [nm] to 5 [nm] in film thickness, for example.

Figure 7A:
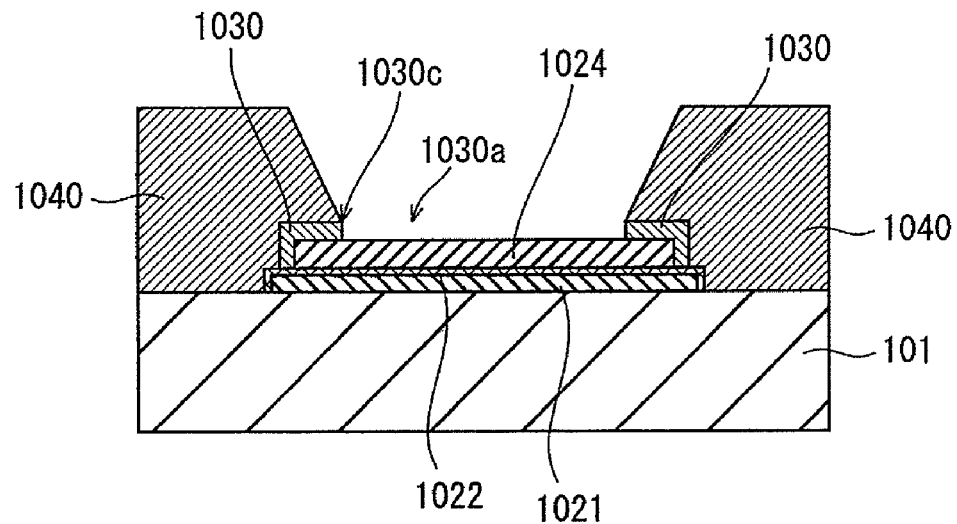
FIGS. 7A, 7B and 7C are end elevations that each schematically show part of the process in manufacturing the display device 1.

Next, a film is formed on the metal oxide layer 1031 with use of an insulating material in a spin coat method, for example. This film is formed for forming the bank 104. The patterning is performed on this film so as to have a predetermined form in exposure and developing methods using a photomask. As a result, a bank preparation layer 1040 (layer formed of a bank material) is formed. Then, substrate cleaning (wet process) is executed with use of neutral detergent and pure water so as to clear etching residue. During the execution of this wet process, a substantially entire portion of the metal oxide layer 1031 that is exposed to an opening formed in the bank preparation layer 1040 elutes since the metal oxide layer 1031 is water-soluble. Thus, the metal oxide layer 1030 has a recess 1030a which is formed under the opening formed in the bank preparation layers 1040 as shown in FIG. 7A. Therefore, a portion of a surface of the metal layer 1024 is exposed to the opening.

Note that a remaining portion of the metal oxide layer 1030 under a remaining portion of the bank preparation layer 1040 other than the opening does not elute. Therefore, portions of the metal oxide layer 1030 corresponding to side walls of the recess 1030a are exposed, and a peripheral edge 1030c is formed in the metal oxide layer 1030.

Next, a portion of the metal layer 1024 that is exposed to the opening of the bank preparation layer 1040 is naturally oxidized again. A combination of the remaining portion of the metal oxide layer 1030 and the newly oxidized portion of the metal layer 1024 is the hole-injection/transport layer 103. Also, the remaining lower portion of the metal layer 1024 that has not been oxidized is an anode metal layer 1023 (see FIG. 7B).

Figure 7B:
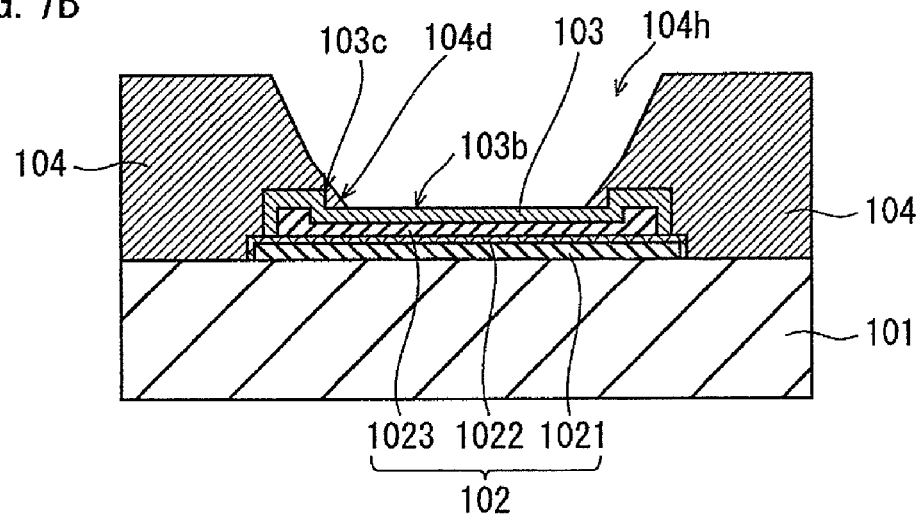

When the organic EL element is in the above-described state, the remaining portion of the bank preparation layer 1040 is thermally treated so as to have some fluidity. As a result, the bank material (insulating material) of the remaining portion of the bank preparation layer 1040 extends to the base 103b of the recess. Thus, the peripheral edge 103c included in the hole-injection/transport layer 103 is covered with the covering portion 104d that is formed by extending the bank material as shown in FIG. 7B.

A heat cure, for example, may be adopted as a method of thermally treating the bank preparation layer 1040. The temperature and time for the heat cure may be appropriately set in view of a type of the bank material and a required thickness of the covering portion 104d, for example. Subsequently, a repellant process is performed on a surface of the remaining portion of the bank preparation layer 1040 with use of fluorine plasma, for example, so as to form the bank 104.

Figure 7C:
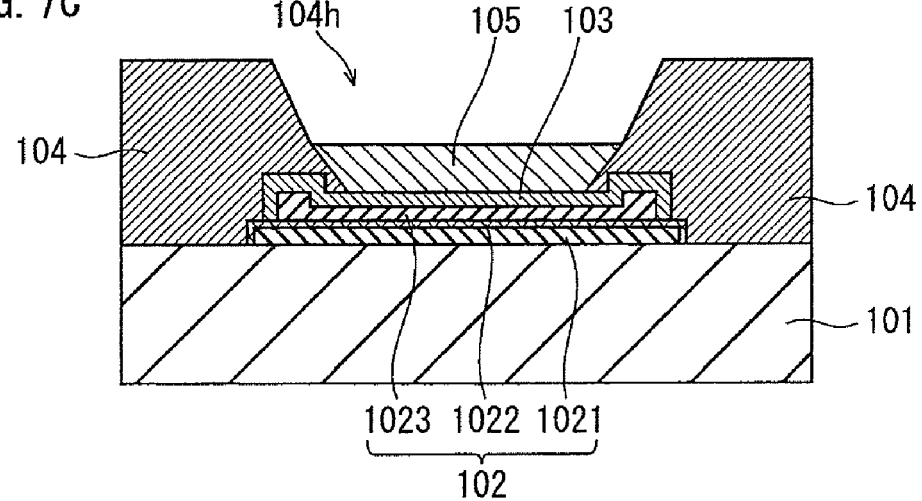

Next, as shown in FIG. 7C, drops of composite ink (hereinafter, simply referred to as "ink") including an organic EL material is put into an area 104h defined by the bank 104 in an inkjet method, for example. The, the ink is dried to form the organic light-emitting layer 105. Note that a dispenser method, a nozzle-coat method, a spin coat method, an intaglio or a letter press, for example, may be adopted as a method of putting drops of the ink.

In the above-described ink drying process, the ink is dried in a vacuum at a temperature of 50° C. for 10 minutes. Then, the ink is baked at a temperature of 130° C. under a nitrogen atmosphere for 30 minutes. An average film thickness of the organic light-emitting layer 105 is approximately 70 [nm].

Figure 8A:
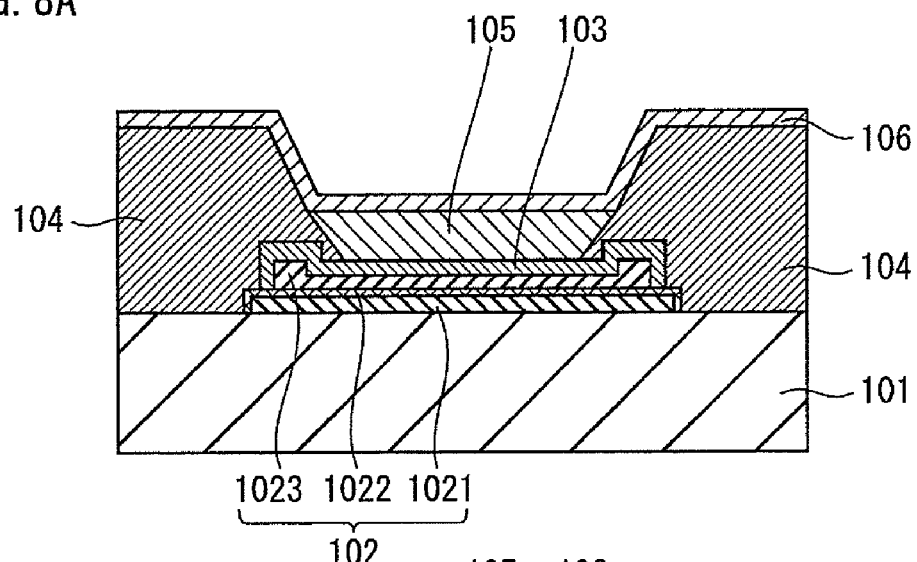
FIGS. 8A, 8B and 8C are end elevations that schematically show part of the process in manufacturing the display device 1.

As shown in FIG. 8A, a film of valium (manufactured by Aldrich, with a purity of 99% or more) that is 5 [nm] in film thickness is formed on the light-emitting layer 105 and the bank 104, with use of a vacuum evaporating method. Subsequently, a film that is 20 [nm] in thickness is formed by combining valium (20%) with compound Alq (manufactured by Shin-Nippon Steel Chemical Co., Ltd., with a purity of 99% or more) with use of a co-evaporation method. Thus, the electron-injection layer 106 is formed.

Figure 8B:
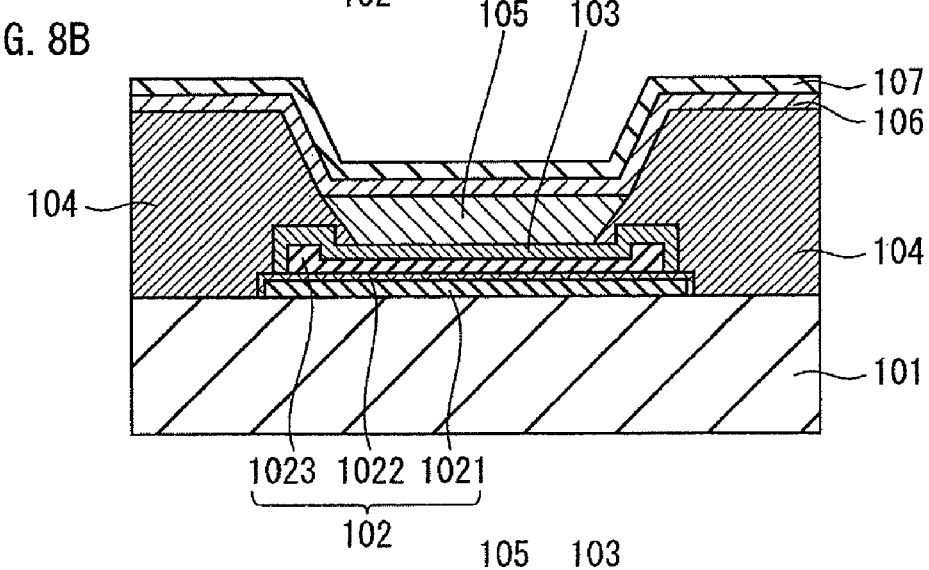
Figure 8C:
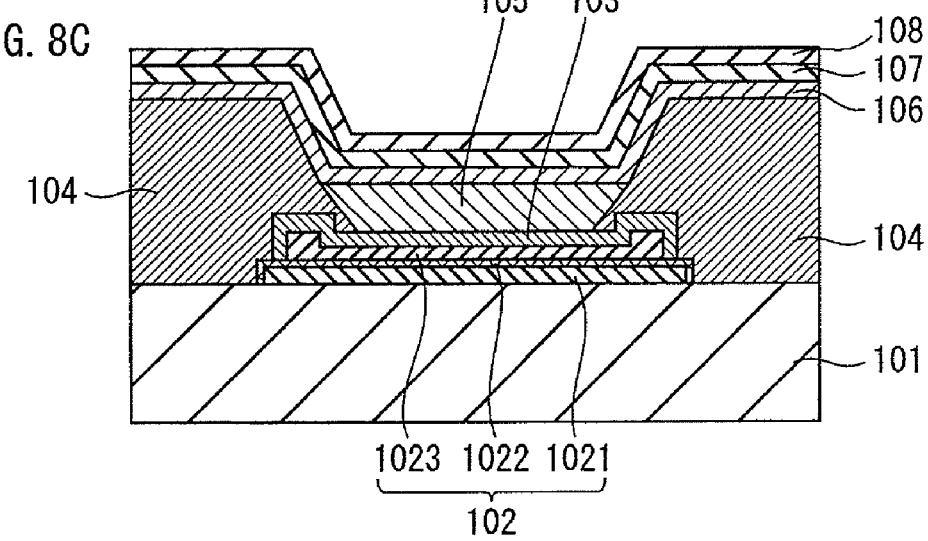

Next, as shown in FIG. 8B, the ITO thin film (100 [nm] in film thickness) is formed on the electron-injection layer 106 with use of a plasma coating apparatus manufactured by Sumitomo Heavy Industries, Ltd., for example. Here, the ITO thin film is to be the cathode 107. Then, the passivation layer 108 is formed on the ITO thin film as shown in FIG. 8C.

According to the method of manufacturing the display panel 10 pertaining to the present embodiment, the peripheral edge 103c that is formed on the exposed portion of the hole-injection/transport layer 103 in the manufacturing process is covered with the covering portion 104d of the bank 104. The organic light-emitting layer 105 is formed on the covering portion 104d. Therefore, it is possible to suppress the electrical field from being concentrated in the peripheral edge 103c of the hole-injection/transport layer 103.

4. Effects

According to the display panel 10 of the display device 1 pertaining to the present embodiment, each of the organic EL elements 100a, 100b and 100c has the hole-injection/transport layer 103 formed with use of the metal oxide. Therefore, each of the organic EL elements 100a, 100b and 100c included in the display panel 10 generally has the following advantages compared to an organic EL element included in a hole-injection/transport layer formed with use of PEDOT. That is, each of the organic EL elements 100a, 100b and 100c has an excellent voltage-current density characteristic, and is unlikely to deteriorate even when a large current is flown to increase the light-emitting intensity.

Also, in each of the organic EL elements 100a, 100b and 100c, the surface portion of the metal layer is oxidized, and the surface portion of the metal layer that has been oxidized becomes the hole-injection/transport layer 103 while the remaining lower portion of the metal layer becomes the anode metal layer 1023 of the anode 102, as shown in FIG. 7B. Therefore, the number of layers to be formed in each of the organic El elements 100a, 100b and 100c can be reduced, and thus the number of processes can be reduced.

Furthermore, in each of the organic EL elements 100a, 100b and 100c, the peripheral edge 103c of the recess 103a included in the hole-injection/transport layer 103 is covered with the covering portion 104d of the bank 104 that is formed with use of the insulating material. Therefore, it is possible to suppress the electrical filed from being concentrated in the peripheral edge 103c when light is emitted. Therefore, it is possible to suppress current from locally flowing to the organic light-emitting layer 105 in each of the organic EL elements 100a, 100b and 100c pertaining to the present embodiment.

[Second Embodiment]

Figure 9:
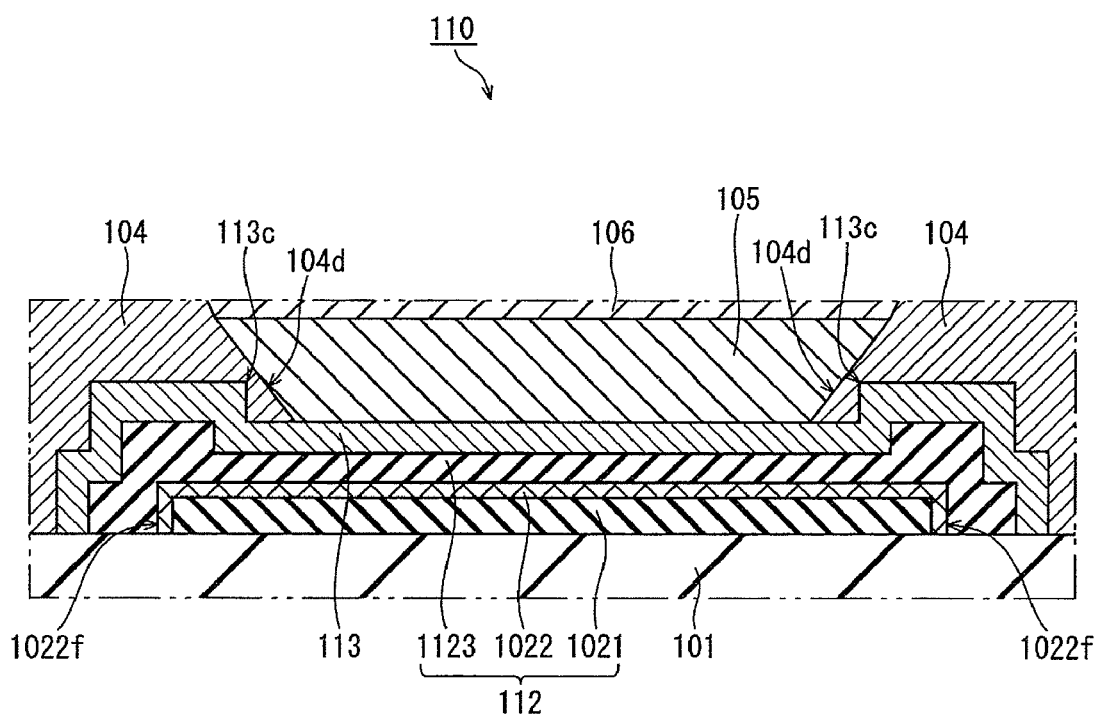
FIG. 9 is an end elevation that shows an enlarged main part of an organic EL element 110 pertaining to a second embodiment.

The following describes a structure of an organic EL element 110 pertaining to a second embodiment, with reference to FIG. 9. Note that elements of the organic EL elements 100a, 100b and 100c that are the same as the elements thereof in the first embodiment have the same reference numerals in FIG. 9, and descriptions thereof are omitted.

As shown in FIG. 9, the organic EL element 110 pertaining to the present embodiment is different from each of the organic EL elements 100a, 100b and 100c in the first embodiment in a form of an anode metal layer 1123 of an anode 112 and a form of a hole-injection/transport layer 113 formed on the anode metal layer 1123. Specifically, in the organic El element 110, the anode metal layer 1123 is formed so as to cover side surfaces 1022f of the ITO layer 1022, and bottom surfaces of end portions of the hole-injection/transport layer 113 are in contact with the principal surface of the substrate 101.

Note that, in the organic EL element 110 pertaining to the present embodiment, a surface portion of the metal layer is oxidized so as to be a metal oxide layer (upper layer). This metal oxide layer is the hole-injection/transport layer 113, and the remaining portion of the metal layer (lower layer) is the anode metal layer 1123 of the hole-injection/transport layer 113. Materials used for forming the anode metal layer 1123 and the hole-injection/transport layer 113 and a method of manufacturing these are basically the same as the first embodiment.

Also, the organic EL element 110 pertaining to the present embodiment also has a recess. The recess is formed by partially depressing an upper surface portion of the hole-transport/injection layer 113. Also, a peripheral edge 113c of the recess is covered with the covering portion 104d of the bank 104. Therefore, the organic EL element 110 pertaining to the present embodiment has exactly the same advantages as those possessed by each of the organic EL elements 100a, 100b and 100c pertaining to the first embodiment.

[Third Embodiment]

Figure 10:
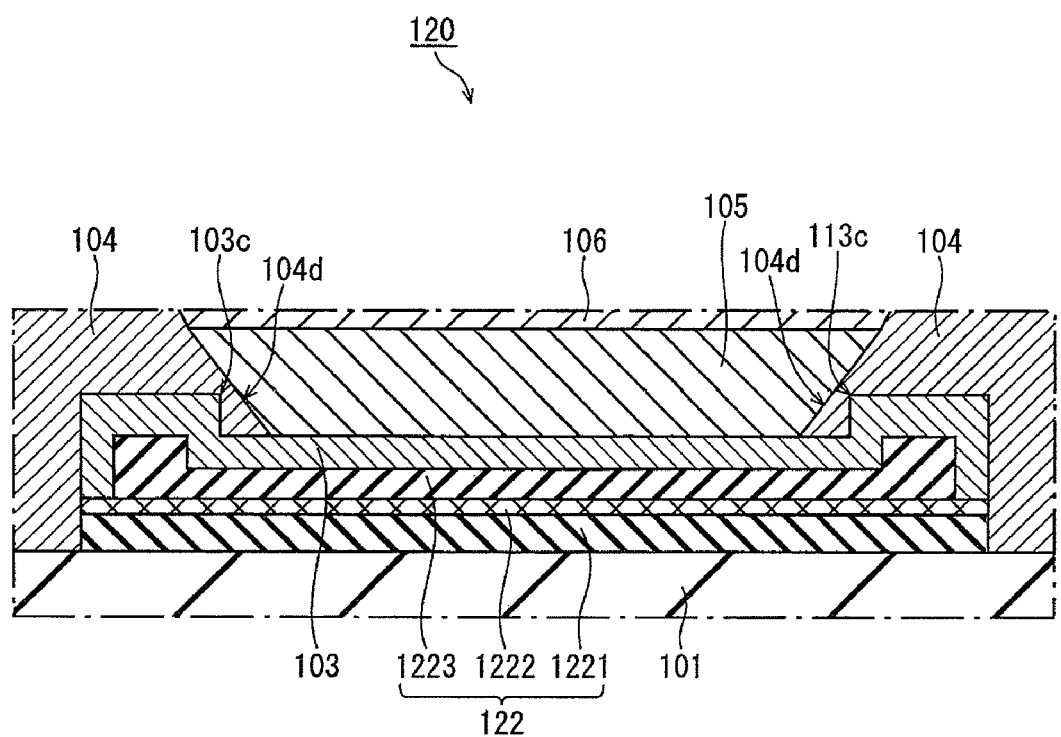
FIG. 10 is an end elevation that shows an enlarged main part of an organic EL element 120 pertaining to a third embodiment.

A description is given of a structure of an organic EL element 120 pertaining to a third embodiment, with reference to FIG. 10. Also, a description is given of characteristics of a method of manufacturing the organic EL element 120, with reference to FIGS. 11A, 11B and 11C. Elements that are the same as elements of the organic EL elements 100a, 100b and 100c pertaining to the first embodiment have the same reference numerals in FIG. 10 and FIGS. 11A, 11B and 11C. Therefore, the descriptions thereof are omitted.

As shown in FIG. 10, the organic EL element 120 pertaining to the present embodiment is different from the organic EL elements 100a, 100b and 100c pertaining to the first embodiment in a form of an anode 122. Specifically, in the present embodiment, an anode base layer 1221 of the anode 122 and an ITO layer 1222 that is layered on the anode base layer 1221 have the same width as the hole-injection/transport layer 103.

The organic EL element 120 pertaining to the present embodiment is the same in other structures as each of the organic EL elements 100a, 100b and 100c pertaining to the first embodiment.

Figure 11A:
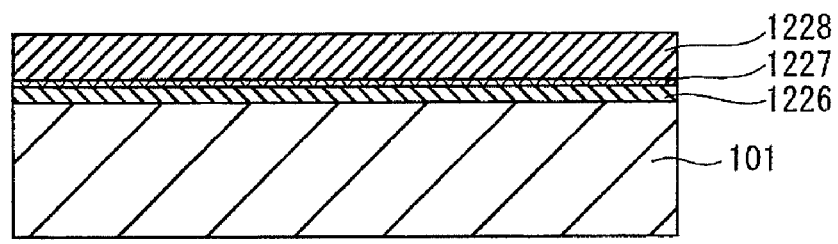
FIG. 11 is an end elevation that schematically shows part of the process in manufacturing the organic El element 120 pertaining to the third embodiment.
Figure 11B:
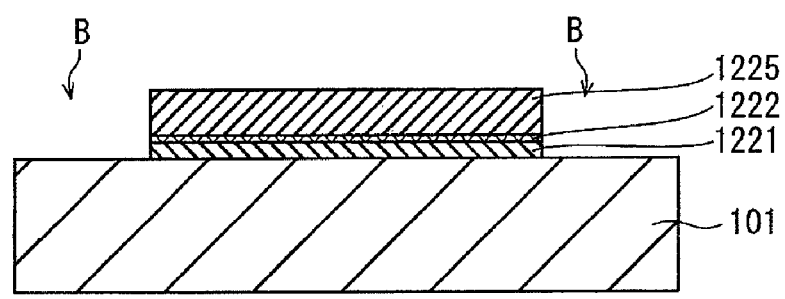
Figure 11C:
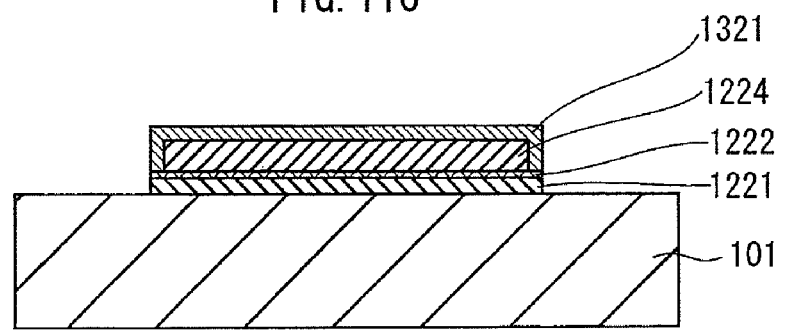

Processes shown in FIG. 11A to FIG. 11C correspond to the above-described processes in the first embodiment shown in FIG. 6A to 6C, respectively. As shown in FIG. 11A, according to the method of manufacturing the organic EL element 120 pertaining to the present embodiment, a metal layer 1226, an ITO layer 1227 and a metal layer 1228 are layered on an upper principal surface of the substrate 101 in the stated order. The metal layer 1226 and the metal layer 1228 are respectively formed with use of the same material as the materials that are used for forming the anode base layer 1021 and the metal layer 1025 in the first embodiment.

Next, as shown in FIG. 11B, the metal layer 1226, the ITO layer 1227 and the metal layer 1228 are collectively etched in each area in which the organic EL element 120 is to be formed. Thus, the anode base layer 1221, the ITO layer 1222 and the metal layer 1225 are layered on the substrate 101 in the stated order.

Next, as shown in FIG. 11C, a surface portion of the metal layer 1228 is naturally oxidized, and the oxidized surface portion of the metal layer 1228 becomes a metal oxide layer

1321. A metal layer 1224 (the remaining lower portion of the metal layer 1228) becomes a base of the anode metal layer 1223 as with the metal layer 1024 shown in FIG. 6C.

Although the subsequent processes are not depicted, the organic EL element 120 is formed by performing the same processes as described with use of FIG. 5 and FIGS. 6A, 6B and 6C in the first embodiment.

According to the organic EL element 120 pertaining to the present embodiment, a surface portion of the metal layer is oxidized, and the oxidized surface portion of the metal layer which is metal oxide layer (upper layer) becomes the hole-injection/transport layer 103. The remaining portion (lower portion) of the metal layer becomes the anode metal layer 1223 of the anode 122. Materials that are used for forming the anode metal layer 1223 and the hole-injection/transport layer 103, and methods for manufacturing the anode metal layer 1223 and the hole-injection/transport layer 103 are basically the same as those in the first embodiment.

Also, according to the organic EL element 120 pertaining to the present embodiment, the hole-injection/transport layer 103 has a recess. The recess is formed by partially depressing the surface portion of the hole-injection/transport layer 103. The peripheral edge 103c of the recess is covered with the covering portion 104d of the bank 104. Therefore, the organic EL element 120 pertaining to the present embodiment has exactly the same advantages as those possessed by each of the organic EL elements 100a, 100b and 100c pertaining to the first embodiment.

[Fourth Embodiment]

Figure 12:
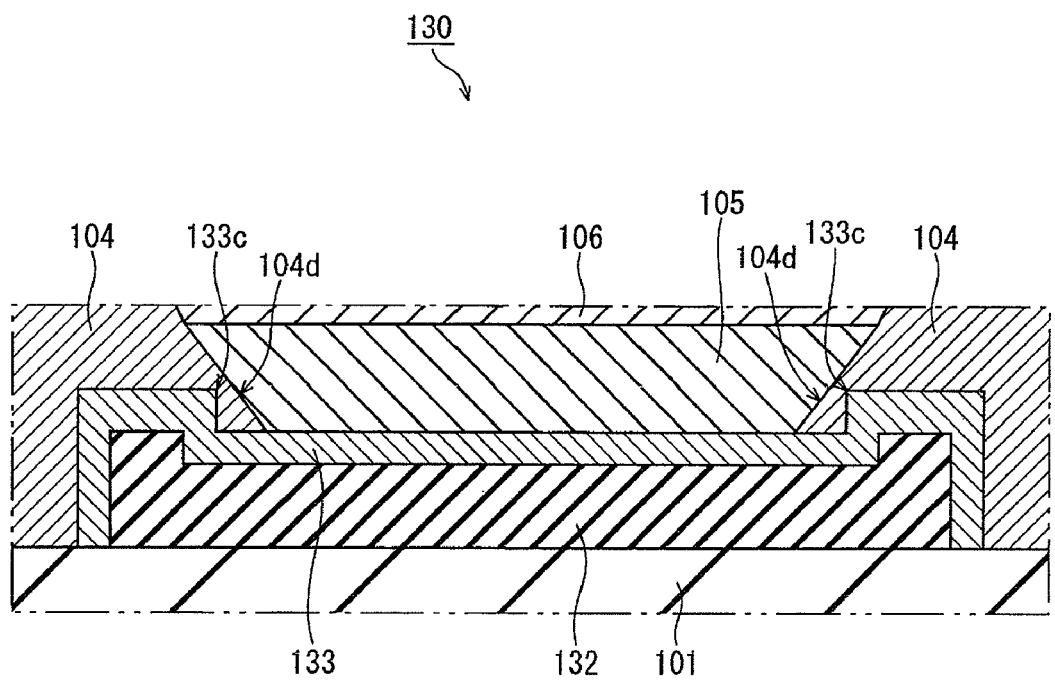
FIG. 12 is an end elevation that schematically shows a main part of an organic EL element 130 pertaining to a fourth embodiment.

The following describes an organic EL element 130 pertaining to a fourth embodiment, with reference to FIG. 12. Note that elements that are the same as the elements of each of the organic EL elements 100a, 100b and 100c pertaining to the first embodiment have the same reference numerals in FIG. 12, and the descriptions thereof are omitted.

As shown in FIG. 12, the organic EL element 130 pertaining to the present embodiment is different from each of the organic EL elements 100a, 100b and 100c pertaining to the first embodiment in that the anode 132 has a monolayer structure in the organic EL element 130 pertaining to the present embodiment. According to the organic El element 130, a metal layer (metal layer) having a monolayer structure is formed on the upper principal surface of the substrate 101. A surface portion of the metal layer is oxidized, and the oxidized portion (upper portion) becomes a hole-injection/transport layer 133. The remaining portion (lower portion) of the metal layer becomes an anode 132. In the organic EL element 130, the hole-injection/transport layer 133 has a recess under the opening of the bank 104, and a peripheral edge 133c of the recess is covered with the covering portion 104d of the bank 104, as with the organic EL element 100a, 100b and 100c.

When the organic EL element 130 pertaining to the present embodiment has a structure in which the anode 132 has the monolayer structure, the number of layers can be further reduced. Thus, the number of manufacturing processes can be reduced compared to the organic EL elements 100a, 100b and 100c pertaining to the first embodiment. Therefore, the organic EL element 130 has an advantage that cost can be further reduced.

Note that the peripheral edge 133c of the recess included in the hole-injection/transport layer 133 is covered with the covering portion 104d of the bank 104 as described above. Therefore, the organic EL element pertaining to the present embodiment has the same advantages as those possessed by each of the organic EL elements 100a, 100b and 100c pertaining to the first embodiment.

[Fifth Embodiment]

Figure 13:
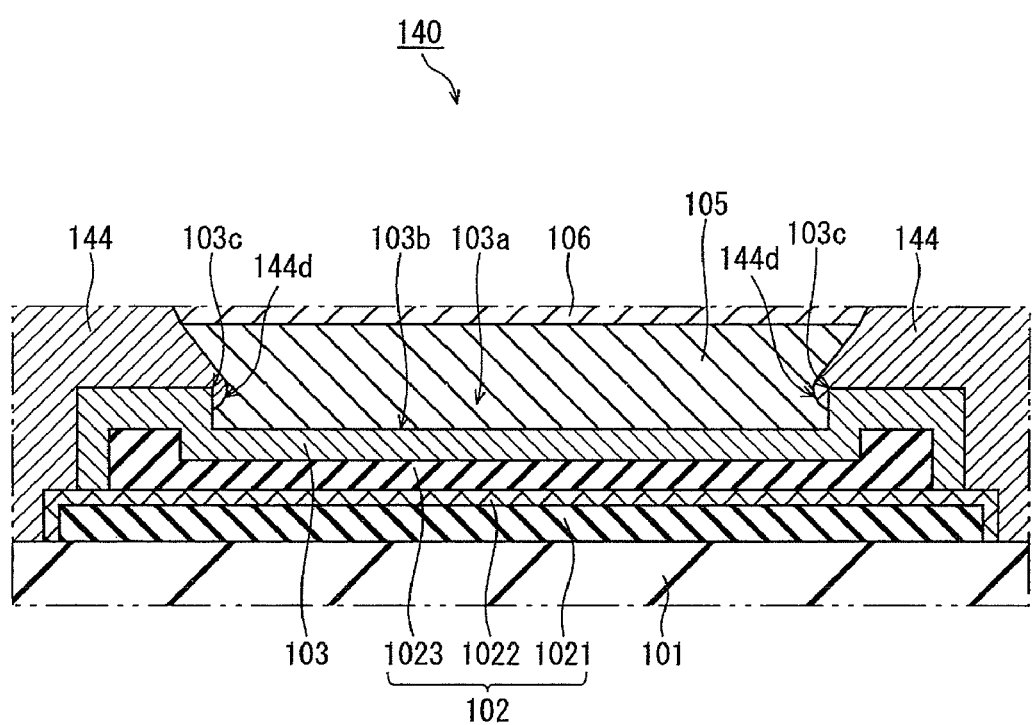
FIG. 13 is an end elevation that schematically shows a main part of an organic EL element 140 pertaining to a fifth embodiment.

The following describes a structure of an organic EL element 140 pertaining to a fifth embodiment, with reference to FIG. 13. Note that elements that are the same as the elements of each of the organic EL elements 100a, 100b and 100c have the same reference numerals in FIG. 13, and the descriptions thereof are omitted.

As shown in FIG. 13, the organic EL element 140 pertaining to the present embodiment is different from each of the organic EL elements 100a, 100b and 100c pertaining to the first embodiment in a form of a covering portion 144d of the bank 144. Specifically, according to the organic EL elements 100a, 100b and 100c pertaining to the first embodiment, the covering portion 104d of the bank 104 reaches the base 103b over the peripheral edge 103c included in the hole-injection/transport layer 103. However, according to the organic EL element 140 pertaining to the present embodiment, the covering portion 144d of the bank 144 covers the peripheral edge 103c of the recess as with the covering portion 104d pertaining to the first embodiment. However, the covering portion 144d of the bank 144 does not reach the base 103b of the recess included in the hole-injection/transport layer 103. With such a structure, the bank material does not have to be extended to the base 103b of the recess included in the hole-injection/transport layer 103. Therefore, it is possible to keep a temperature for the heat treatment low and to shorten time necessary for the heat treatment.

Note that the peripheral edge 103c of the recess included in the hole-injection/transport layer 103 is covered with the covering portion 144d of the bank 144, as described above, in the organic EL element pertaining to the present embodiment. Therefore, the organic EL element pertaining to the present embodiment has the same advantages as those possessed by each of the organic EL elements 100a, 100b and 100c pertaining to the first embodiment.

[Modifications]

Figure 14A:
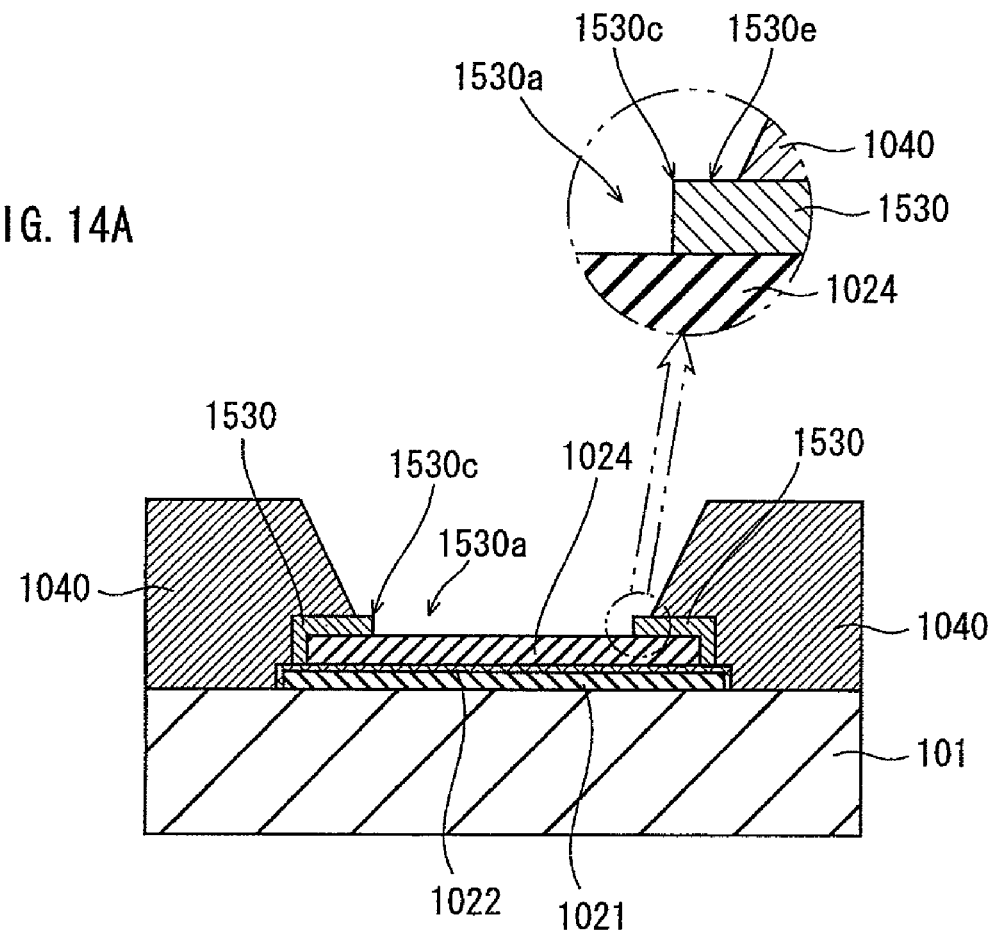
FIGS. 14A and 14B each are an end elevation that schematically shows part of the process in manufacturing an organic El element pertaining to a modification.
Figure 14B:
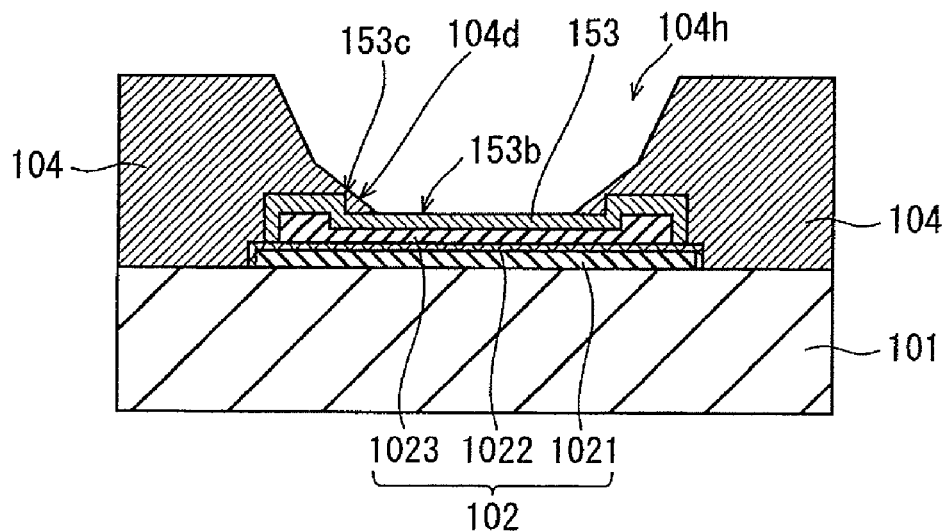

In the above-described first to fifth embodiments, an explanatory structure is adopted in which a lower end of each inner side wall of the bank preparation layer 1040 is flush with the peripheral edge 103c of the recess included in the metal oxide layer 1030 as shown in FIG. 7A. However, the present invention does not necessarily have to have this structure. The following explanatory case as shown in FIG. 14A is also possible. The lower end of each inner side wall of the bank preparation layer 1040 may be positioned further from the recess than a peripheral edge 1530c of a recess 1530a included in a metal oxide layer 1530. Thus, an area 1530e of a portion of the metal oxide layer 1530 that is not depressed (see a part of FIG. 14A enclosed by a two-dot chain line) is exposed.

In other words, the peripheral edge 1530c is defined by an angle formed between a portion of the upper surface of the metal oxide layer 1530 on which the recess is not formed and each side wall of the recess 1530a.

Even with the above-described structure, the same advantages possessed by each of the organic EL elements 100a, 100b and 100c pertaining to the first embodiment (advantages obtained by the covering portion 104d included in the bank 104) can be obtained by the following. The bank preparation layer 1040 is thermally treated so that the peripheral edge 1530c of the recess 1530a is covered with a portion of the bank 104.

In the above-described first to fifth embodiments, a high-molecule organic material is used for forming the organic light-emitting layer 105 as an example. However, the same advantages as those possessed by the first to fifth embodiments can be obtained even when a low-molecule organic material is used for forming the organic light-emitting layer 105.

Also, it is assumed that the organic EL elements 100a, 100b, 100c, 110, 120, 130 and 140 pertaining to the above-described first to fifth embodiments are used in the display panel 10. However, when the organic EL elements are used in a lighting device that performs a surface light emitting, for example, the electrodes 102, 112, 122 and 132 may be uniformly formed on a whole surface or a most of the surface of the substrate 101.

Alternatively, these electrodes 102, 112, 122 and 132 may be patterned so that a specific geometric figure or a specific character may be displayed. In this case, since characteristically-patterned light can be emitted, organic EL elements having such a structure may be used for displaying advertisements.

Note that the above-described hole-injection/transport layers 103, 113, 133 and 153 may be provided as the hole-injection layer, the hole-transport layer or the hole-injection/transport layer.

Also, in the above-described first to third and fifth embodiments, the anode base layers 1021 and 1221 of the anodes 102, 112, 122 and 132 are formed with use of the Ag thin film. Also, the ITO layers 1022 and 1222 are respectively formed on the anode base layers 1021 and 1221. Alternatively, the anode base layers 1021 and 1221 of the anodes 102, 112, 122 and 132 may be formed with use of an alumina material. In both of these cases, the ITO layers may be omitted.

Also, in the above-described first to fifth embodiments, an explanatory structure is adopted in which the so-called pixel bank (bank having a lattice-shaped plane surface) is used (see FIG. 4). However, speaking of the plane view of each of the banks 104 and 144, a line bank, for example, may be used as each of the banks 104 and 144. The following describes supplemental explanations on the plane view of the line bank with use of FIG. 15.

Figure 15:
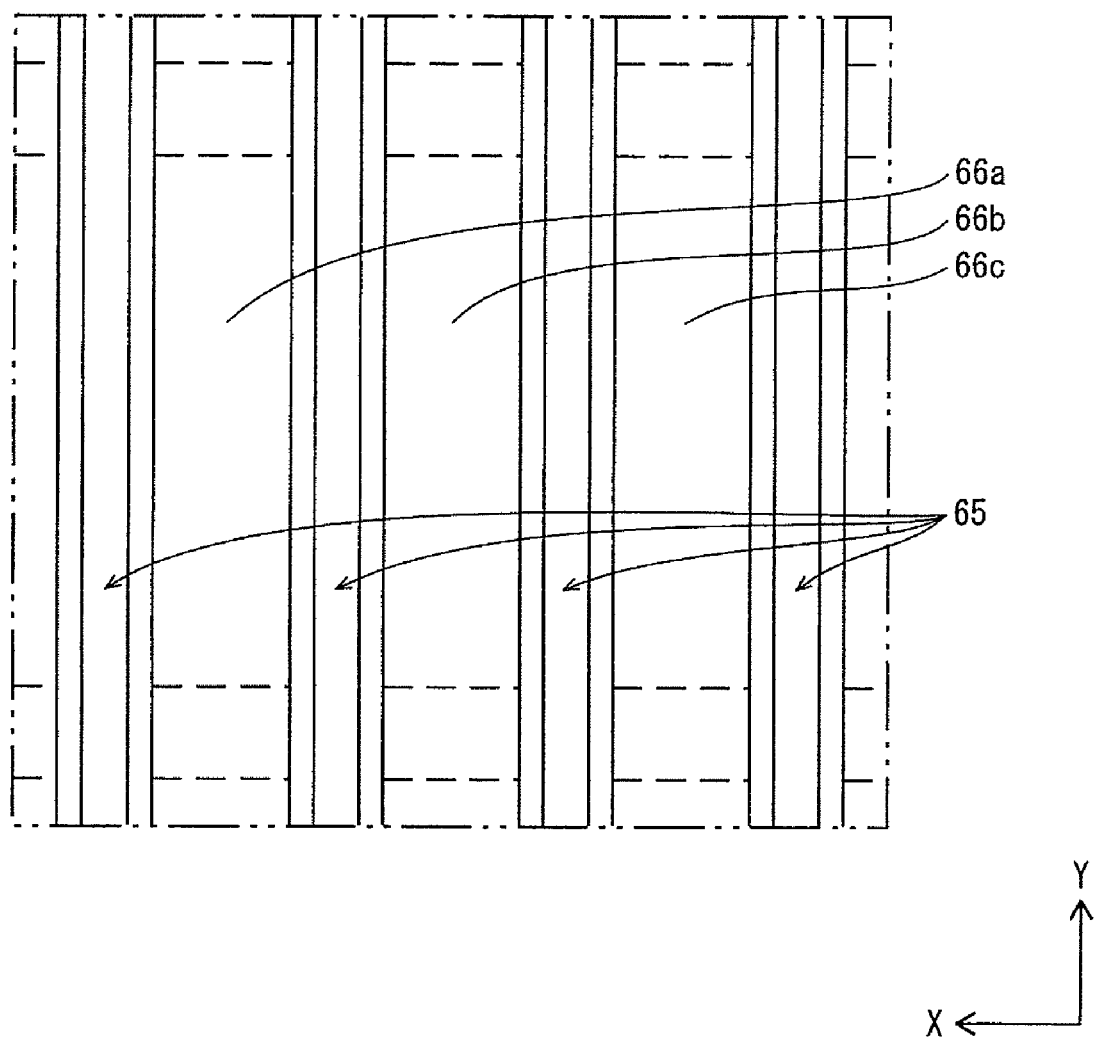
FIG. 15 is a schematic plane view showing a form of a line bank 65 pertaining to the modification.

As shown in FIG. 15, when banks arranged in lines (line bank) 65 are adopted, organic light-emitting layers 66*a*, 66*b* and 66*c* that are arranged consecutively in an X direction are delimited.

Note that when the line banks 65 are adopted, organic light-emitting elements that are arranged consecutively in a Y direction are not defined by bank elements. However, the organic light-emitting elements can emit light without affecting one another by appropriately setting the drive method, a size of anodes and a distance between the anodes, for example.

Also, in the above-described first to fifth embodiments, the organic EL elements are top-emission EL elements. However, the organic EL elements pertaining to the present invention are not limited to this, and may be bottom-emission EL elements.

Also, in the above-described first to fifth embodiments, the explanatory structure is adopted in which only the electron-injection layer 106 is provided between the organic light-emitting layer 105 and the cathode 107. However, a structure may be adopted in which the electron-transport layer is provided between the organic light-emitting layer 105 and the cathode 107 in addition to the electron-injection layer 106.

Furthermore, in the above-described first to fifth embodiments, the surface portion of the metal layer is oxidized, and the oxidized surface portion of the metal layer is each of the hole-injection/transport layer 103, 113 and 133. However, when a structure is adopted in which the cathode is arranged under each of the banks 104 and 144, the oxidized surface portion may be the electron-injection layer, the electron-transport layer or the electron-injection/transport layer.

Also, although an aspect of the display device 1 is not shown in the above-described first to fifth embodiments, the display device may have an aspect as shown in FIG. 16.

Industrial Applicability

The present invention is useful for realizing organic EL elements that are suitable for use in a display device, a lighting device, etc.

What is claimed is:

1. A light-emitter, comprising:
a first electrode;
a layered body disposed on the first electrode, the layered body including a charge injection layer and a light-emitting layer;
a second electrode disposed on the layered body; and
a bank that defines a position of the light-emitting layer, wherein the charge injection layer is formed by oxidation of an upper portion of a metal,
the first electrode includes a metal layer that is a lower portion of the metal,
an inner portion of the charge injection layer is depressed to define a recess, and
a portion of the bank is on an outer portion of the charge injection layer.

2. The light-emitter of claim 1, wherein a bottom surface of the light-emitting layer corresponds to a bottom surface of the recess.

3. The light-emitter of claim 1, wherein
the bank is formed by a solution, and
the solution is erosive to the charge injection layer formed by oxidation of the upper portion of the metal.

4. The light-emitter of claim 1, wherein
the portion of the bank that is on the outer portion of the charge injection layer is adjacent the recess, and
an inner side wall of the bank slopes upwardly with respect to a bottom surface of the recess.

5. The light-emitter of claim 1, wherein the portion of the bank that is on the outer portion of the charge injection layer is displaced from a bottom surface of the recess.

6. The light-emitter of claim 1, wherein the first electrode has one of a monolayer structure and a layer structure.

7. The light-emitter of claim 6, wherein the first electrode has the layer structure including the metal layer over a lower layer having a visible light reflectance of at least approximately 60%.

8. The light-emitter of claim 6, wherein
the first electrode has the layer structure including the metal layer over a lower layer,
the metal layer comprises at least one of molybdenum, chrome, vanadium, tungsten, nickel and iridium, and
the lower layer is an alloy that comprises at least one of aluminum and silver.

9. The light-emitter of claim 1, wherein the metal layer has a thickness of at most approximately 20 nm.

10. The light-emitter of claim 1, wherein the light-emitting layer is an organic EL layer.

11. The light-emitter of claim 1, wherein the outer portion of the charge injection layer protrudes along a base of the bank.

12. The light-emitter of claim 1, wherein the portion of the bank that is on the outer portion of the charge injection layer is defined by an angle formed between two surfaces, one of the two surfaces being a top surface of the outer portion of the charge injection layer and the other of the two surfaces being a side wall of the bank.

13. A light-emitting device including a plurality of the light-emitter of claim 1.

* * * * *